United States Patent
Lin et al.

(10) Patent No.: US 10,964,247 B2
(45) Date of Patent: Mar. 30, 2021

(54) DISPLAY SYSTEM

(71) Applicant: AU Optronics Corporation, Hsin-Chu (TW)

(72) Inventors: Ya-Ting Lin, Hsin-Chu (TW); Chung-Hung Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/727,245

(22) Filed: Dec. 26, 2019

(65) Prior Publication Data

US 2020/0402437 A1    Dec. 24, 2020

(30) Foreign Application Priority Data

Jun. 20, 2019    (TW) .................................. 108121564

(51) Int. Cl.

| | | |
|---|---|---|
| *G09G 3/20* | (2006.01) | |
| *G11C 19/28* | (2006.01) | |
| *H02M 3/07* | (2006.01) | |
| *H03K 3/356* | (2006.01) | |
| *H04B 5/00* | (2006.01) | |

(52) U.S. Cl.
CPC .............. *G09G 3/20* (2013.01); *G11C 19/28* (2013.01); *H02M 3/07* (2013.01); *H03K 3/356113* (2013.01); *H04B 5/0031* (2013.01); *G09G 2310/0267* (2013.01); *G09G 2310/0286* (2013.01); *G09G 2310/08* (2013.01)

(58) Field of Classification Search
CPC .............. G09G 3/20; G09G 2310/08; G09G 2310/0267; G09G 2310/0286; G09G 3/3266; H03K 3/356113; H02M 3/07; G11C 19/28; H04B 5/0031; H01Q 1/243; H01Q 7/00
See application file for complete search history.

(56) References Cited

U.S. PATENT DOCUMENTS 5,701,189 A * 12/1997 Koda .................... H04B 10/801
                                                                      340/13.24
6,281,851 B1 * 8/2001 Tay ........................ H01Q 1/242
                                                                      343/702

(Continued)

FOREIGN PATENT DOCUMENTS

| CN | 101383119 A | 3/2009 |
|---|---|---|
| TW | 201628347 A | 8/2016 |

OTHER PUBLICATIONS

Yasuhiro Sugita et al., "Integrated Transparent NFC Antenna on Touch Display" INP5-3, IDW 2017, p. 1604-1607.

*Primary Examiner* — Koosha Sharifi-Tafreshi
(74) *Attorney, Agent, or Firm* — WPAT, PC (57) ABSTRACT

A display system includes a pixel array, an antenna, a reader circuit, and a gate driver circuit. The antenna is configured to transmit a radio frequency (RF) signal in response to a wireless communication. The reader circuit is coupled to the antenna and is configured to receive the RF signal. The gate driver circuit is coupled to the reader circuit and the pixel array. The reader circuit is further configured to generate a clock signal according to the RF signal and transmit the clock signal to the gate drive circuit. The gate driver circuit is configured to generate scanning signals according to the clock signal and transmit the scanning signals to the pixel array.

9 Claims, 8 Drawing Sheets

(56) References Cited

U.S. PATENT DOCUMENTS

| | | | |
|---|---|---|---|
| 8,970,467 B2* | 3/2015 | Chan | G09G 3/3677 |
| | | | 345/100 |
| 2006/0209055 A1 | 9/2006 | Wakita | |
| 2007/0216668 A1* | 9/2007 | Miyamoto | G06F 3/147 |
| | | | 345/204 |
| 2009/0066711 A1 | 3/2009 | Hou et al. | |
| 2010/0182207 A1 | 7/2010 | Miyata et al. | |
| 2013/0229319 A1* | 9/2013 | Miura | H01Q 9/27 |
| | | | 343/788 |
| 2016/0105183 A1 | 4/2016 | Kim | |
| 2016/0112219 A1* | 4/2016 | Lee | H04B 5/0031 |
| | | | 455/77 |
| 2020/0192542 A1* | 6/2020 | Chang | G09G 3/3648 |

* cited by examiner

FIG. 5B

DISPLAY SYSTEM

CROSS-REFERENCE TO RELATED APPLICATION

This application claims priority to Taiwan Application Serial Number 108121564, filed Jun. 20, 2019, which is herein incorporated by reference in its entirety.

BACKGROUND

Field of Invention

The present disclosure is associated with a display system. In particularly, it is associated with a display system including a reader circuit configured to drive a gate driver circuit.

Description of Related Art

The display system includes a display panel and a circuit board, in which the display panel is driven to perform the operations by the gate driver circuit. The gate driver circuit needs a clock and operating voltages provided by the circuit board, thus, the gate driver circuit on the display panel cooperates with the clock and the voltages provided by the circuit board to control the display panel.

When the display system senses a near-field communication, a reader circuit reads a sensing signal transmitted from an antenna, and transmits an initial signal to the gate driver circuit according the sensing signal, to make the gate driver circuit start to scan a pixel array in the display panel. Therefore, the gate driver circuit is able to be enabled by the power and the clock provided by the circuit board, and the gate driver circuit starts to scan the pixel array by the initial signal transmitted from the reader circuit.

SUMMARY

The disclosure provides a display system including a pixel array, an antenna, a reader circuit, and a gate driver circuit. The antenna is configured to transmit a radio frequency (RF) signal in response to a wireless communication. The reader circuit is coupled to the antenna, and configured to receive the RF signal. The gate driver circuit is coupled to the reader circuit and the pixel array. The reader circuit is further configured to generate a clock signal according to the RF signal and transmit the clock signal to the gate drive circuit. The gate driver circuit is configured to generate scanning signals according to the clock signal and transmit the scanning signals to the pixel array.

The disclosure provides a display system including a pixel array, a reader circuit, and a gate driver circuit. The reader circuit is configured to receive a radio frequency signal to generate a first control voltage and a second control voltage. The gate driver circuit is coupled to the pixel array and the reader circuit, configured to receive the first control voltage and the second control voltage, and configured to generate a scanning signal according to the first control signal and the second control signal to control the pixel array. The pixel array, the reader circuit, and the gate driver circuit are implemented on a display device of the display system.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

In this document, the term "circuitry" may be used herein to describe a system including one of more circuit. The term "circuit" may be used herein to describe a device having one or more transistors and/or one or more active elements connecting in a particular configuration to process signal.

Figure 1:
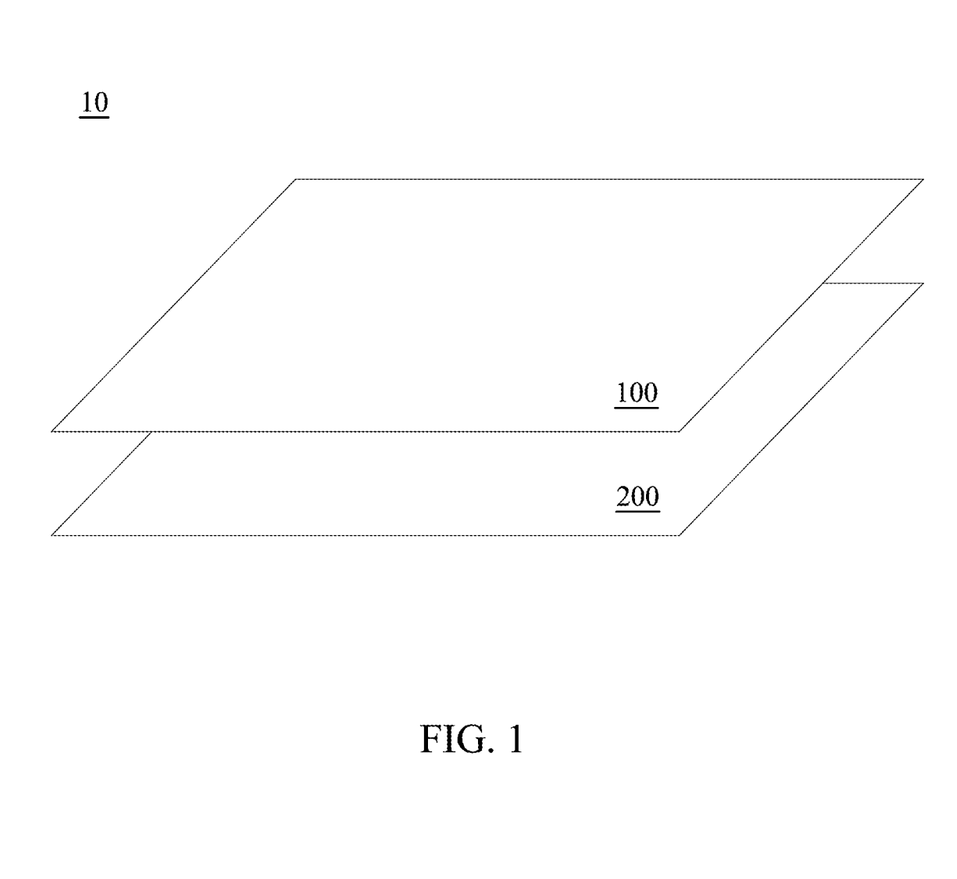
FIG. 1 is a schematic diagram of a display system, in accordance with some embodiments of the present disclosure.

Reference is now made to FIG. 1. FIG. 1 is a schematic diagram of a display system 10 according to some embodiments of the present disclosure. For illustration in FIG. 1, the display system 10 includes a display device 100 and a circuit device 200. In some embodiments, the display device 100 is coupled to the circuit device 200, and the display device 100 and the circuit 200 are devices located at different layers. In some embodiments, the display device 100 is also referred to as a panel, and the circuit device 200 is also referred to as a circuit panel.

In some embodiments, the display system 10 is configured to sense a near-field communication (NFC) by the display device 100 to drive the circuit device 200, and to generate signals to the display device 100 by the circuit device 200 to make the display device 100 perform display operations. In some embodiments, the near-field communication is generated by approaches an external device (not shown) to the display system 10, and display system 10 performs the operations in response to the near-field communication. The external device mentioned above is, for example, a sensing card. In some embodiments, the near-field communication is also referred to as near-field wireless communication, which is a short distance wireless communication technology. For the ease of understanding, the other elements and the connections thereof in the display system 10 are not shown in FIG. 1.

The display system 10 can be implemented by an electronic system having the display function and near-field communication such as a smart phone, a computer pad, a point-of-sale terminal, a digital billboard, etc.

Figure 2A:
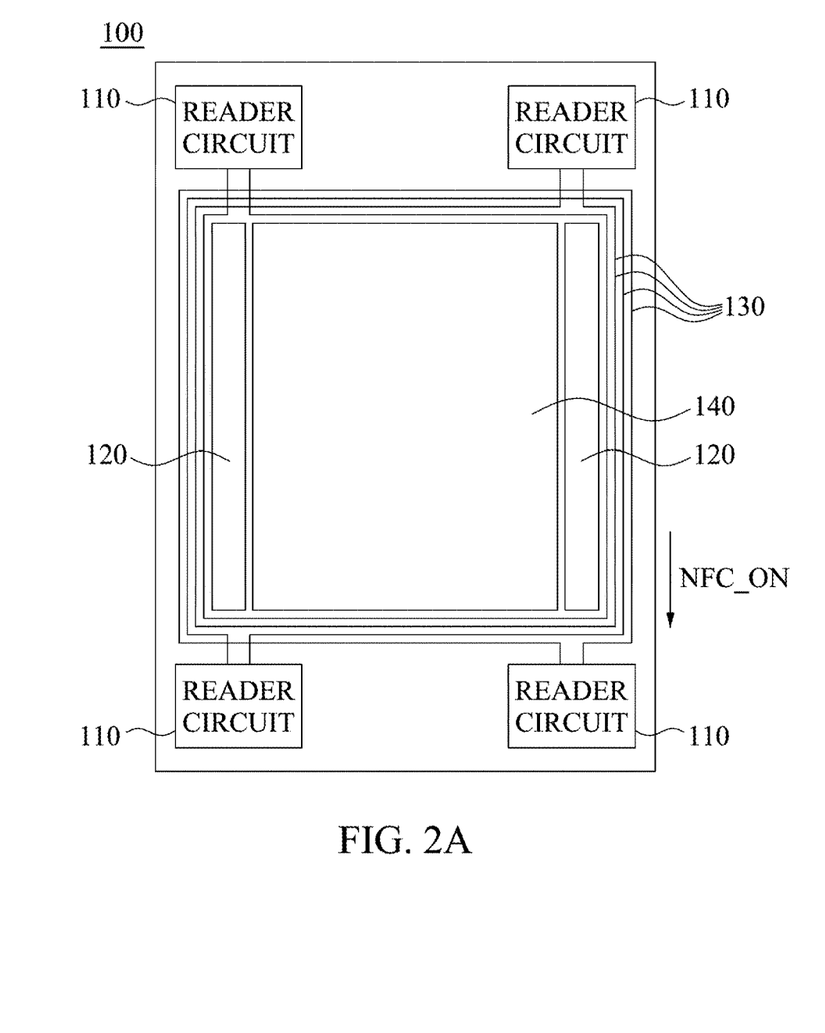
FIG. 2A is a schematic diagram of the display device shown in FIG. 1, in accordance with some embodiments of the present disclosure.
Figure 2B:
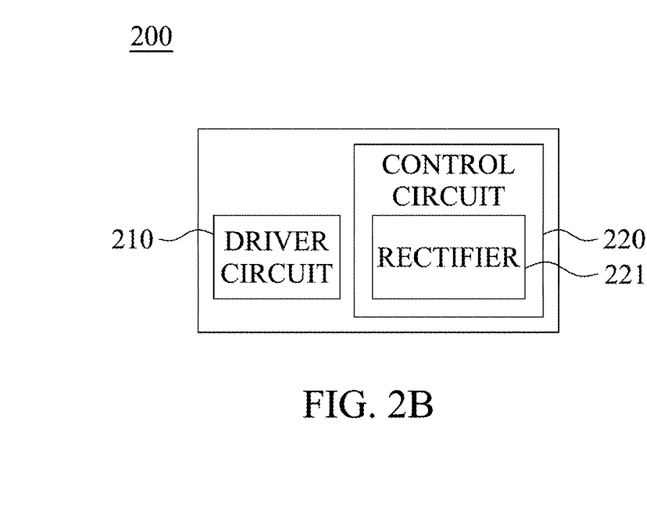
FIG. 2B is a schematic diagram of the circuit device shown in FIG. 1, in accordance with some embodiments of the present disclosure.

Reference is made to FIG. 2A and FIG. 2B. FIG. 2A is a schematic diagram of the display device 100 shown in FIG. 1 according to some embodiments of the present disclosure. For illustration in FIG. 2A, the display device 100 includes a reader circuit 100, a gate driver circuit 120, an antenna 130, and a pixel array 140. In some embodiments, the reader circuit 110 is coupled to the antenna 130 and the gate driver circuit 120, and gate driver circuit 120 is coupled to the pixel array 140, in which the pixel array 140 includes pixels (not shown.) FIG. 2B is a schematic diagram of the circuit device 200 shown in FIG. 1 according to some embodiments of the present disclosure. For illustration in FIG. 2B, the circuit device 200 includes a driver circuit 210 and a control circuit 220, in which the control circuit 220 includes a rectifier 221.

In some embodiments, the antenna 130 is configured to sense a near-field communication, for example, a sensing card having a sensing coil approaches the display system 10 to generate electromagnetic induction. When the antenna 130 senses the near-field communication, the antenna 130 transmits the inductive current generated by the electromagnetic induction to the circuit device 200. After receiving the inductive current, the circuit device 200 is driven to generate radio frequency (RF) signal NFC_ON by driver circuit 210, and further to transmit the radio frequency signal NFC_ON by the antenna 130 to the reader circuit 110. In some other embodiments, the circuit device 200 further rectifies the radio frequency signal NFC_ON by the rectifier 221, and transmits the radio frequency signal NFC_ON being rectified to the reader circuit 110. In some embodiments, the frequency of the radio frequency signal NFC_ON is about 13.56 MHz.

In some embodiments, after the reader circuit 110 receives the radio frequency signal NFC_ON which is rectified, the reader circuit 110 generates a control voltage $V_{GH}$ and a control voltage $V_{GL}$ (shown in FIG. 3A) according to the radio frequency signal NFC_ON, and transmits the control voltage $V_{GH}$ and the control voltage $V_{GL}$ to the gate driver circuit 120. The gate diver circuit 120 generates scanning signals G(n) (shown in FIG. 5A) according to the control voltage $V_{GH}$ and the control voltage $V_{GL}$, and transmits the scanning signals G(n) to the pixel array 140 to control the pixel array 140.

In some other embodiments, after the reader circuit 110 receives the radio frequency signal NFC_ON, the reader circuit 110 generates a clock signal CK1 (shown in FIG. 4A) according to the radio frequency signal NFC_ON, and transmits the clock signal CK1 to the gate driver circuit 120. The gate diver circuit 120 generates the scanning signals G(n) according to the clock signal CK1, and transmits the scanning signals G(n) to the pixel array 140 to control the pixel array 140.

Figure 3A:
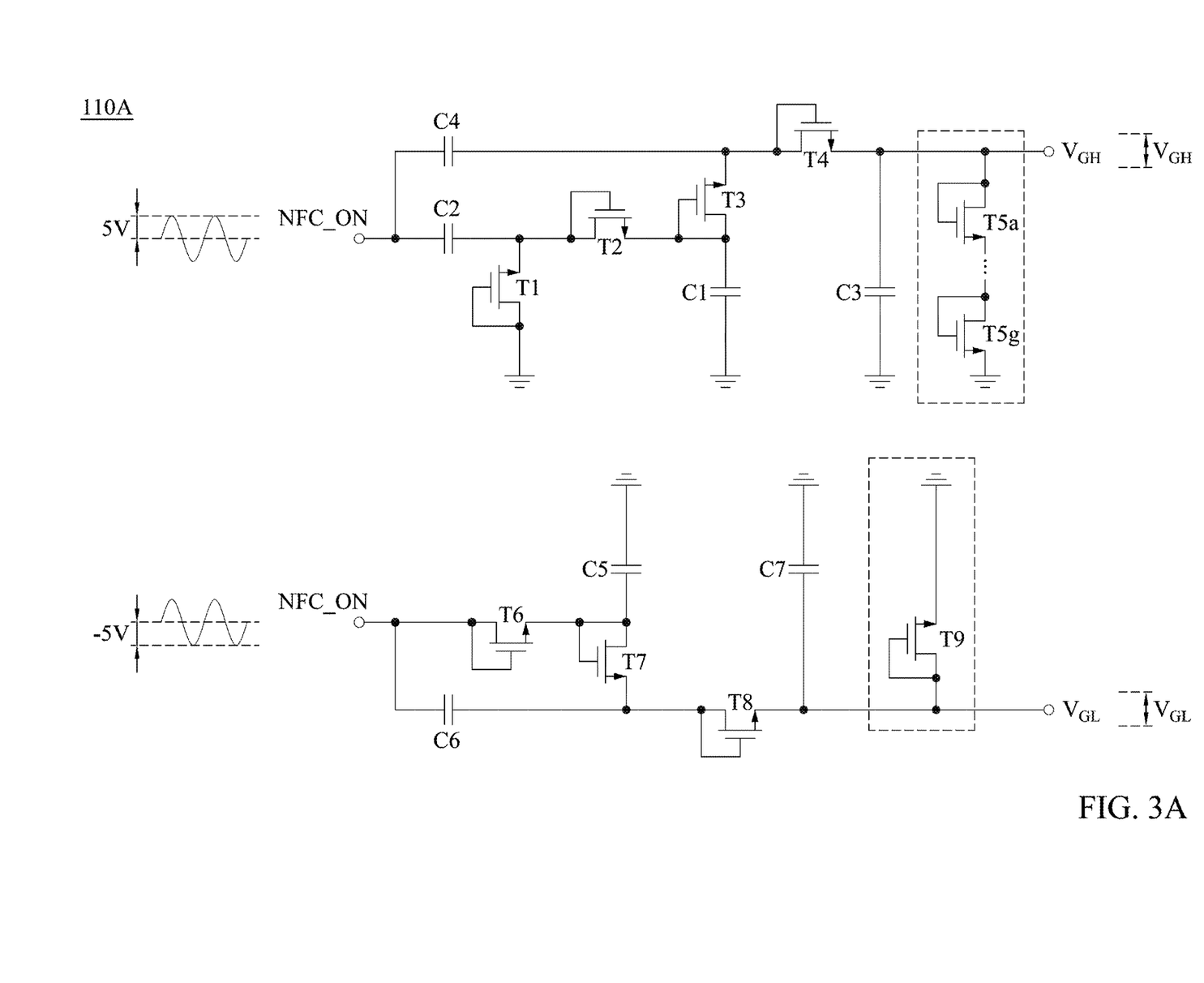
FIG. 3A is a schematic diagram of a part of the reader circuit shown in FIG. 2A, in accordance with some embodiments of the present disclosure.

Reference is made to FIG. 3A. FIG. 3A is a schematic diagram of a part of the reader circuit 110 shown in FIG. 2A according to some embodiments of the present disclosure. In FIG. 3A, a charge pump circuit 110A is a part of the reader circuit 110. For illustration in FIG. 3A, the charge pump circuit 110A includes transistors T1, T2, T3, T4, T5a-T5g, T6, T7, T8, T9 and capacitors C1, C2, C3, C4, C5, C6, C7. A first region of the charge pump circuit 110A includes the transistors T1, T2, T3, T4, T5a-T5g and capacitors C1, C2, C3, C4, and the first region of the charge pump circuit 110A is configured to receive the radio frequency signal NFC_ON to generate the control voltage $V_{GH}$. A second region of the charge pump circuit 110A includes the transistors T6, T7, T8, T9 and the capacitors C5, C6, C7, and the second region of the charge pump circuit 110A is configured to receive the radio frequency signal NFC_ON to generate the control voltage $V_{GL}$. The control voltage $V_{GH}$ is larger than the control voltage $V_{GL}$.

For illustration in FIG. 3A, in the first region of the charge pump circuit 110A, first terminals of the capacitors C2, C4 are configured to receive the radio frequency signal NFC_ON; a second terminal of the capacitor C2 is coupled to a first terminal of the transistors T1, a first terminal of the transistor T2, and a gate terminal of the transistor T2; a second terminal and a gate terminal of the transistor T1 are coupled to the ground; a second terminal of the transistor T2 is coupled to a first terminal of the capacitor C1, a second terminal of the transistor T3, and a gate terminal of the transistor T3; a second terminal of the capacitor C1 is coupled to the ground; a second terminal of the capacitor C4 is coupled to a first terminal of the transistor T3, a first terminal of the transistor T4, and a gate terminal of the transistor T4; and a second terminal of the transistor T4 is coupled to the ground, a first terminal of the transistor T5a, and a gate terminal of the transistor T5a. In some embodiments, seven transistors T5a-T5g are connected in series, and each of the first terminals of the transistors T5a-T5g is couple to the gates of the transistors T5a-T5g, respectively. In addition, the second terminal of the transistor T5g is coupled to the ground. The second terminal of the transistor T4 is further configured to output the control voltage $V_{GH}$.

For illustration in FIG. 3A, in the second region of the charge pump circuit 110A, a first terminal of the transistor T6, a gate terminal of the transistor T6, and a first terminal of capacitor C6 are configured to receive the radio frequency signal NFC_ON; a second terminal of the transistor T6 is coupled to a second terminal of capacitor C5 and a first terminal of the transistor T7; a first terminal of the capacitor C5 is coupled to the ground; a second terminal of the capacitor C5, a second terminal of the transistor T7, and a gate of the transistor T7 are coupled to a first terminal of the transistor T8 and a gate terminal of the transistor T8; a second terminal of the transistor T8 is coupled to a second terminal of the capacitor C7, a second terminal of the transistor T9, and a gate terminal of the transistor T9; and a first terminal of the transistor T9 is coupled to the ground. The second terminal of the transistor is further configured to generate the control voltage $V_{GL}$.

In some embodiments, the radio frequency signal NFC_ON is a sine wave. After the radio frequency signal NFC_ON passes through the rectifier 211, the positive part of the radio frequency signal NFC_ON is inputted into the first region of the charge pump circuit 110A, and the negative part of the radio frequency signal NFC_ON is inputted into the second region of the charge pump circuit 110A. The charge pump circuit 110A is configured to adjust the level of the radio frequency signal NFC_ON which is rectified, and to output the control voltage $V_{GH}$ and the control voltage $V_{GL}$ according to the adjusted level. For example, a 10V amplitude of the radio frequency signal NFC_ON being rectified is pulled up to 30V and pulled down to −10V, and the voltage is outputted as 30V and −10V. Alternatively stated, the charge pump circuit 110A is configured to generate the control voltage $V_{GH}$ and the control voltage $V_{GL}$ by the rectified radio frequency signal NFC_ON.

Figure 3B:
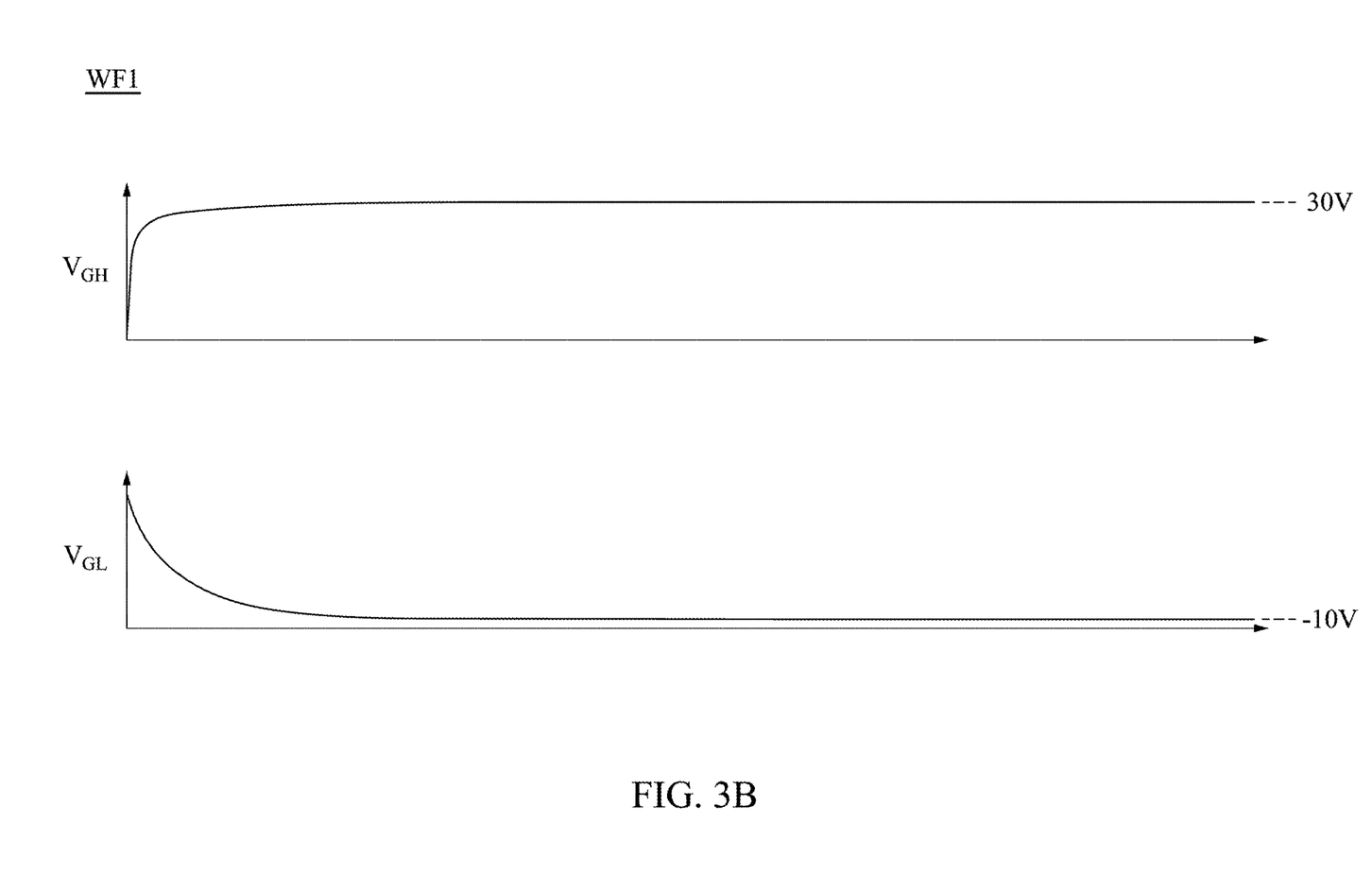
FIG. 3B is a waveform diagram of a waveform operated in the charge pump circuit shown in FIG. 3A, in accordance with some embodiments of the present disclosure.

Reference is made to FIG. 3B. FIG. 3B is a waveform diagram WF1 of a waveform operated in the charge pump circuit 110A shown in FIG. 3A according to some embodiments of the present disclosure. For illustration in FIG. 3B, the waveform diagram WF1 shows the relationship of the waveform of control voltages $V_{GH}$, $V_{GL}$ with time. The most left side of the waveform diagram WF1 is illustrated that the beginning when the rectified radio frequency signal NFC_ON is inputted into the charge pump circuit 110A, the output of the charge pump circuit 110A is 0V or floating. After the radio frequency signal NFC_ON is inputted for a period of time, the output of the charge pump circuit 110A reaches convergence. Therefore, the right side of the waveform diagram WF1 shows the charge pump circuit 110A outputs control voltages $V_{GH}$, $V_{GL}$ which have about fixed values.

The amplitude of the radio frequency signal NFC_ON and the levels of the control voltages $V_{GH}$, $V_{GL}$ mentioned above are provided for illustrative purposes. Various amplitudes of the radio frequency signal NFC_ON and the levels of the control voltages $V_{GH}$, $V_{GL}$ are within the contemplated scope of the present disclosure.

Figure 4A:
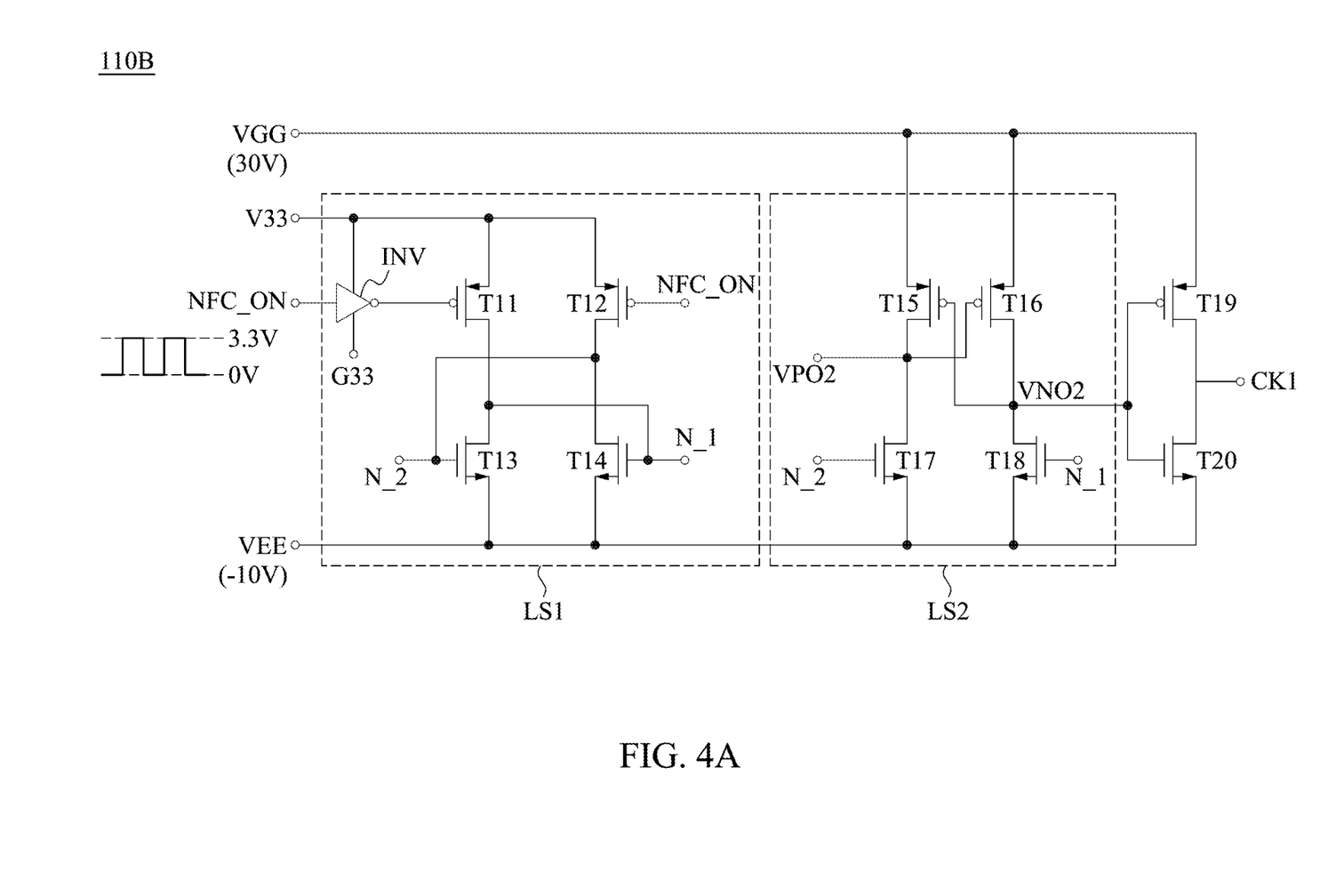
FIG. 4A is a schematic diagram of a part of the reader circuit shown in FIG. 2A, in accordance with some embodiments of the present disclosure.

Reference is made to FIG. 4A. FIG. 4A is a schematic diagram of a part of the reader circuit 110 shown in FIG. 2A according to some embodiments of the present disclosure. In FIG. 4A, the level shift circuit 110B is a part of the reader circuit 110. In some embodiments, the level shift circuit 110B is configured to shift the level of the amplitude of the radio frequency signal NFC_ON, and to output the amplified radio frequency signal NFC_ON as the clock signal CK1.

For illustration in FIG. 4A, the level shift circuit 110B includes a first stage LS1 and a second stage LS2, and the first stage LS1 is coupled to the second stage LS2. The first stage LS1 of the level shift circuit 110B includes an inverter INV and transistors T11, T12, T13, and T14, and the second stage LS2 of the level shift circuit 110B includes transistors T15, T16, T17, T18, T19, and T20.

For illustration in FIG. 4A, in the first stage LS1 of the level shift circuit 110B, an input terminal of the inverter INV and a gate terminal of the transistor T12 are configured to receive the radio frequency signal NFC_ON; an output terminal of the inverter INV is coupled to a gate terminal of the transistor T11; a first control terminal of the inverter INV, a first terminal of the transistor T11, and a first terminal of the transistor T12 are configured to receive a supply voltage V33; a second control terminal of the inverter INV is configured to receive a supply voltage G33; a second terminal of the transistor T11 (node N_1) is coupled to a first terminal of the transistor T13 and a gate terminal of the transistor T14; a second terminal of the transistor T12 (node N_2) is coupled to a gate terminal of the transistor T13 and a first terminal of the transistor T14; and a second terminal of the transistor T13 and a second terminal of the transistor T14 are configured to receive a supply voltage VEE. In the second stage LS2 of the level shift circuit 110B, a first terminal of the transistor T15, a first terminal of the transistor T16, and a first terminal of the transistor T19 are configured to receive a supply voltage VGG; a second terminal of the transistor T15 (node VPO2) is coupled to a first terminal of the transistor T17 and a gate terminal of the transistor T16; a second terminal of the transistor T16 (node VNO2) is coupled to a gate terminal of the transistor T15, a first terminal of the transistor T18, a gate terminal of the transistor T19, and a gate terminal of the transistor T20; a gate terminal of the transistor T17 is coupled to the second terminal of the transistor T12 and the gate terminal of the transistor T13 in the first stage LS1 through the node N_2; a gate terminal of the transistor T18 is coupled to the second terminal of the transistor T11 and the gate terminal of the transistor T14 in the first stage LS1 through the node N_1; a second terminal of the transistor T17, a second terminal of the transistor T18, and a second terminal of the transistor T20 are configured to receive a supply voltage VEE; and a second terminal of the transistor T19 is coupled to a first terminal of the transistor T20 and configured to output the clock signal CK1. The nodes N_1, N_2, VPO2, and VNO2 mentioned above are provided for better description of the connections, and is also configured for test points of the waveform diagram WF2 shown in FIG. 4B below.

In some embodiments, the radio frequency signal NFC_ON is a square wave. The first stage LS1 of the level shift circuit 110B is configured to shift the amplitude of the radio frequency signal NFC_ON to a level between the supply voltage V33 and the supply voltage VEE, and transmit the shifted radio frequency signal NFC_ON to the second stage LS2 through the node N_1 and the node N_2. The second stage LS2 of the level shift circuit 110B is configured to further shift the amplitude of the radio frequency signal NFC_ON shifted by the first stage LS1 to a level between the supply voltage VGG and the supply voltage VEE to output as the clock signal CK1.

Alternatively stated, the level shift circuit 110B is configured to amplify the radio frequency signal NFC_ON to a range between the supply voltage VGG and the supply voltage VEE to output as the clock signal CK1. Therefore, the clock signal CK1 and the radio frequency signal NFC_ON have the same frequency.

In the embodiment of FIG. 4A, the supply voltage VGG is 30V, and the supply voltage is −10V. Therefore, the amplitude of the radio frequency signal NFC_ON is shifted to 30V to −10V by the level shift circuit 110B.

Figure 5A:
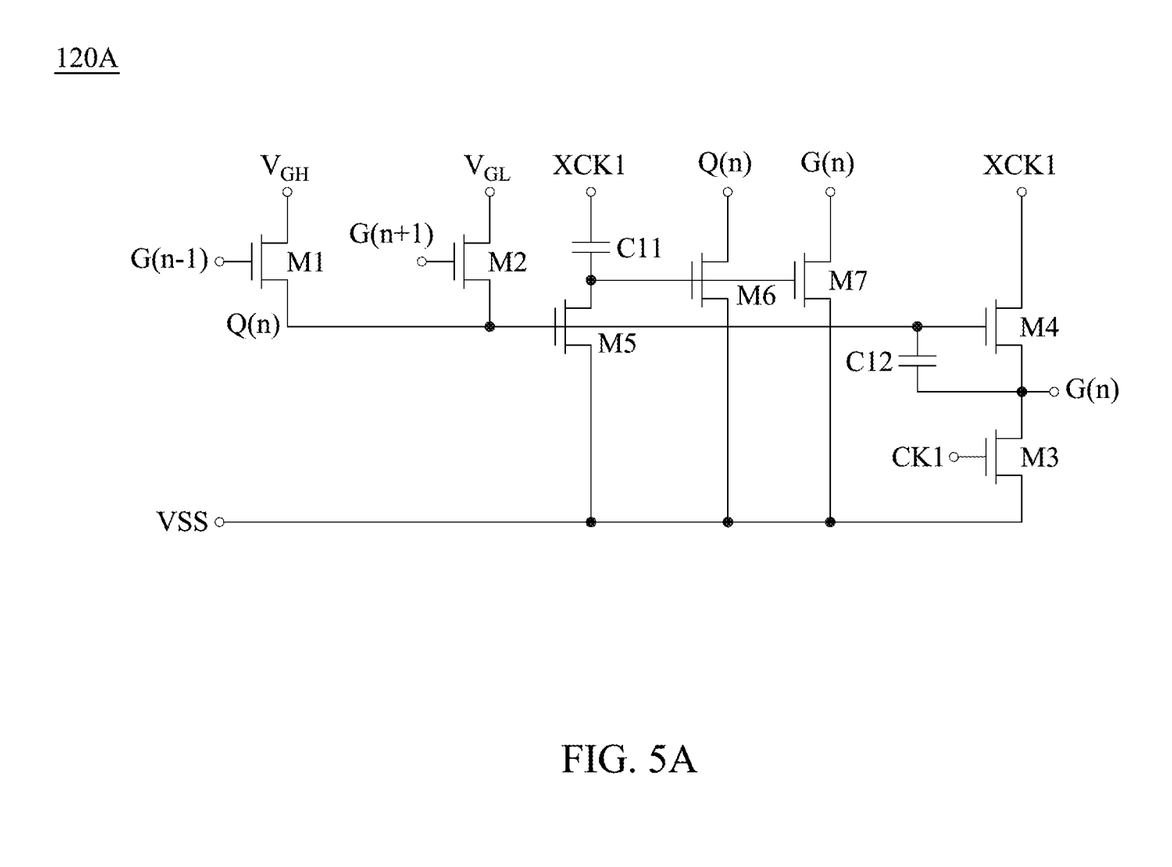
FIG. 5A is schematic diagram of a part of the gate driver circuit shown in FIG. 2A, in accordance with some embodiments of the present disclosure.

In some embodiments, the reader circuit 110 further includes an inverter (not shown) configure to invert the clock signal CK1 to generate a clock signal XCK1 (shown in FIG. 5A).

Figure 4B:
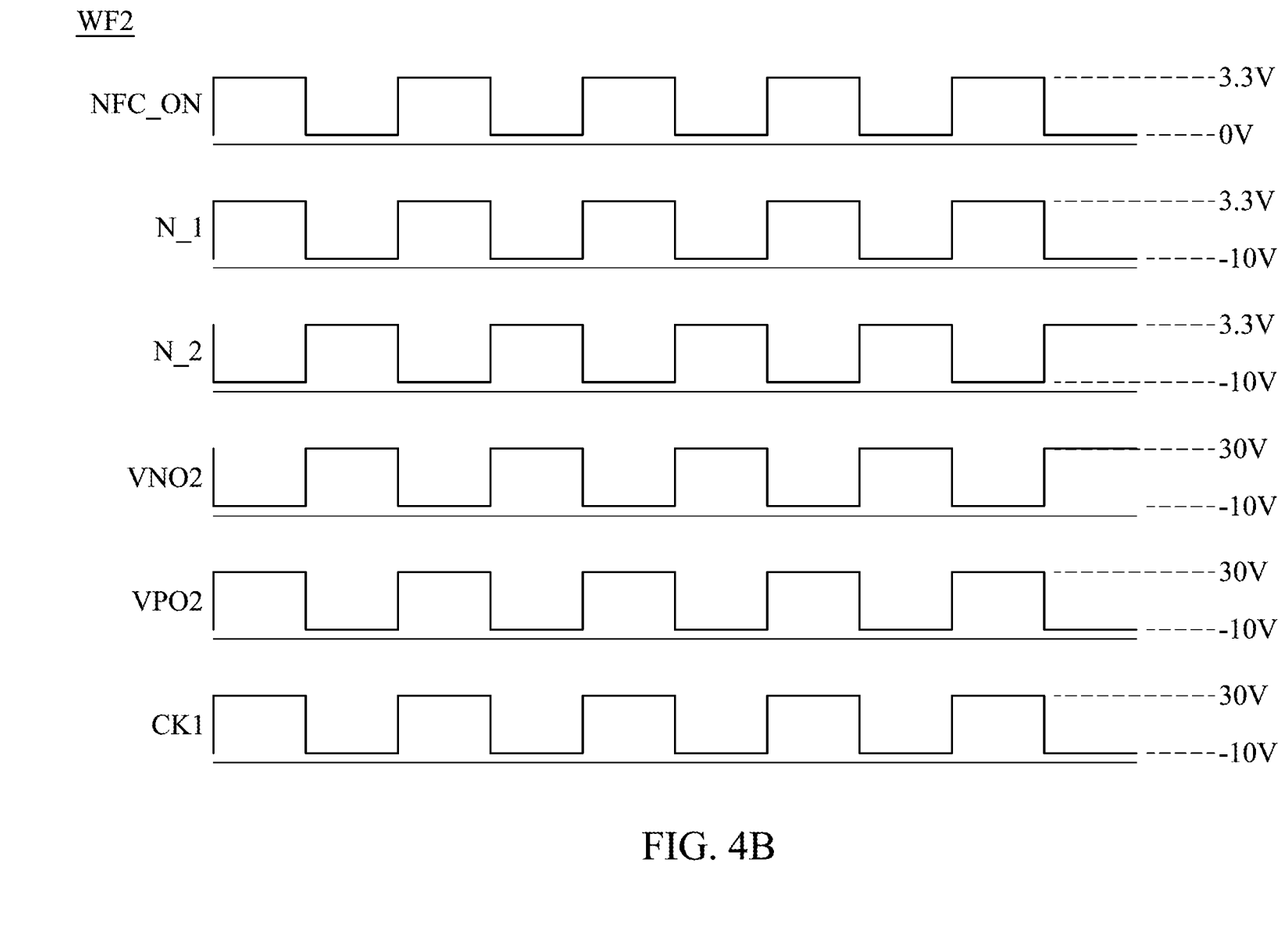
FIG. 4B is a waveform diagram of a waveform operated in the level shift circuit shown in FIG. 4A, in accordance with some embodiments of the present disclosure.

Reference is made to FIG. 4B. FIG. 4B is a waveform diagram WF2 of a waveform operated in the level shift circuit 110B shown in FIG. 4A according to some embodiments of the present disclosure. For illustration in FIG. 4B, the waveform diagram WF2 shows the waveform of the radio frequency signal NFC_ON, the signal on the nodes N_1, the signal on the node N_2, the signal on the node VNO2, the signal on the node VPO2, and the clock signal CK1, and the corresponding relationship thereof with time.

In the embodiments of waveform diagram WF2, the amplitude of the radio frequency signal NFC_ON is 3.3V to 0V, the supply voltage V33 is 3.3V, the supply voltage VEE is −10V, and the supply voltage VGG is 30V. The first stage LS1 of the level shift circuit 110B shifts the amplitude of the radio frequency signal NFC_ON to the level between the supply voltage V33 and the supply voltage VEE according to the amplitude of the radio frequency signal NFC_ON, the supply voltage V33, and the supply voltage VEE. The first stage outputs the signals on the nodes N_1 and N_2 to the second stage LS2 based on the shifted radio frequency signal NFC_ON. For illustration in FIG. 4B, the amplitude of the signals on the nodes N_1 and N_2 are 3.3V to −10V, and are inverted to each other. The second stage LS2 of the level shift circuit 110B shifts the signals on the nodes N_1 and N_2 to a level between the supply voltage VGG and the supply voltage VEE to output as the clock signal CK1 according to the signals on the nodes N_1 and N_2, the supply voltage VGG, and the supply voltage VEE. For illustration in FIG. 4B, the amplitude of the clock signal CK1 is 30V to −10V.

In some embodiments, the signals on the nodes VPO2 and VNP2 are inverted to each other, and the amplitudes of the signals on the nodes VPO2 and VNO2 are the same as the amplitude of the clock signal CK1. In some embodiments, the signals on the nodes, N_1, N_2, VPO2, and VNP2 are configured to check whether the operations on the level shift circuit 110 is corrected.

The amplitude of the radio frequency signal NFC_ON and the levels of the supply voltages VGG, V33, and VEE are provided for illustrative purposes. Various amplitudes of the radio frequency signal NFC_ON and the levels of the supply voltages VGG, V33, and VEE are within the contemplated scope of the present disclosure.

Reference is made to FIG. 5A. FIG. 5A is schematic diagram of a part of the gate driver circuit 120 shown in FIG. 2A according to some embodiments of the present disclosure. In FIG. 5A, a shift register 120A is a part of the gate driver circuit 120. In some embodiments, the gate driver circuit 120 includes multi-stage shift registers, and the shift register 120A shown in FIG. 5A is one of a shift register in the multi-stage shift registers.

In some embodiments, the shift register 120A is configured to generate a scanning signal G(n) according to the clock signal CK1 and the clock signal XCK1. The shift register 120A is configured to generate the scanning signal G(n) further according to the previous stage scanning signal G(n−1) shift register (not shown) and the following stage scanning signal G(n+1) shift register (no shown). In some embodiments, the shift register 120A is configured to receive the control signal $V_{GH}$ and the control signal $V_{GL}$, and to determine to pull up the scanning signal G(n) to the control signal $V_{GH}$ or to pull down the scanning signal G(n) to the control signal $V_{GL}$ according to the clock signal CK1, the clock signal XCK1, the previous stage scanning signal G(n−1), and the following stage scanning signal G(n+1). In some embodiment, the shift register 120A transmits the scanning signal G(n) to the pixel array 140 to control the pixel array 140. Alternatively stated, the gate driver circuit 120 is configured to output scanning signals (for example, scanning signals G(n−1), G(n), and G(n+1)) to the pixel array 140 to control the pixel array 140.

In some embodiments, in the gate river circuit 120 having the multi-stage shift registers, because the first stage shift register does not have an output of a previous stage, the display system 10 generate and transmit an initial signal START_PULSE to the first stage shift register as an output of the previous stage. Furthermore, in the gate driver circuit 120, the last stage shift register does not have an output of a following stage, the display system 10 generate and transmit a ceasing signal END_PULSE to the last stage shift register as an output of the following stage.

For illustration in FIG. 5A, the shift register 120A includes transistors M1, M2, M3, M4, M5, M6, M7 and capacitors C11, C12. A first terminal of the transistor M1 is configured to receive the control voltage $V_{GH}$, and the transistor M1 is also referred to as a pull-up transistor in some embodiments. A gate terminal of the transistor M1 is configured to receive the precious stage scanning signal G(n−1), a second terminal of the transistor M1 is coupled to a second terminal of the transistor M2, a gate terminal of the transistor M5, a gate terminal of the transistor M4, and a first terminal of the capacitor C12. A first terminal of the transistor M2 is configured to receive the control voltage $V_{GL}$, the transistor M2 is also referred to as a pull-down transistor in some embodiments. A gate terminal of the transistor M2 is configured to the following stage scanning signal G(n+1). A first terminal of the transistor M4 is configured to receive the clock signal XCL1, and a second terminal of the transistor M4 is coupled to a second terminal of the capacitor C12 and a first terminal of the transistor M3. The shift register 120A outputs the scanning signal G(n) by the second terminal of the transistor M4. A gate terminal of the transistor M3 is configured to receive the clock signal CK1, and a second terminal of the transistor M3 is configured to receive the supply voltage VSS. A first terminal of the capacitor C11 is configured to receive the clock signal XCK1, and a second terminal of the capacitor C11 is coupled to a first terminal of the transistor M5, a gate terminal of the transistor M6, and a gate terminal of the transistor M7. A second terminal of the transistor M5 is configured to receive the supply voltage VSS. A first terminal of the transistor M6 is coupled to the second terminal of the transistor M1, and configured to receive the signal Q(n) on the second terminal of the transistor M1, and a second terminal of the transistor M6 is configured to receive the supply voltage VSS. A first terminal of the transistor M7 is configured to receive the scanning signal G(n), and a second terminal of the transistor M7 is configured to receive the supply voltage VSS. In some embodiments, the supply voltage VSS is connected to the ground.

In some embodiments, the control voltages $V_{GH}$, $V_{GL}$ received by the shift register 120A in the gate driver circuit 120 are provided by the charge pump circuit 110A in the reader circuit 110. Alternatively stated, in the gate driver circuit 120, at least part of the control voltage is provided by the reader circuit 110. When the antenna 130 senses a near-field communication, the reader circuit 110 receives the radio frequency signal NFC_ON to generate the control signals $V_{GH}$, $V_{GL}$, and provides the control signals $V_{GH}$, $V_{GL}$ to the gate driver circuit 120 for utilization. The gate driver 120 generates the scanning signals G(n) to control the pixel array 140 according to the control signals $V_{GH}$, $V_{GL}$.

In some other embodiments, the clock signals CK1, XCK1 received by the shift register 120A in the gate driver circuit 120 are provided by the level shift circuit 110B in the reader circuit 110. Alternatively stated, in the gate driver circuit 120, the clock signals are provided by the reader circuit 110. When the antenna 130 senses a near-field communication, the reader circuit 110 receives the radio frequency signal NFC_ON to generate the clock signals CK1, XCK1, and provides the clock signals CK1, XCK1 to the gate driver circuit 120 for utilization. The gate driver 120 generates the scanning signals G(n) to control the pixel array 140 according to the clock signals CK1, XCK1.

Figure 5B:
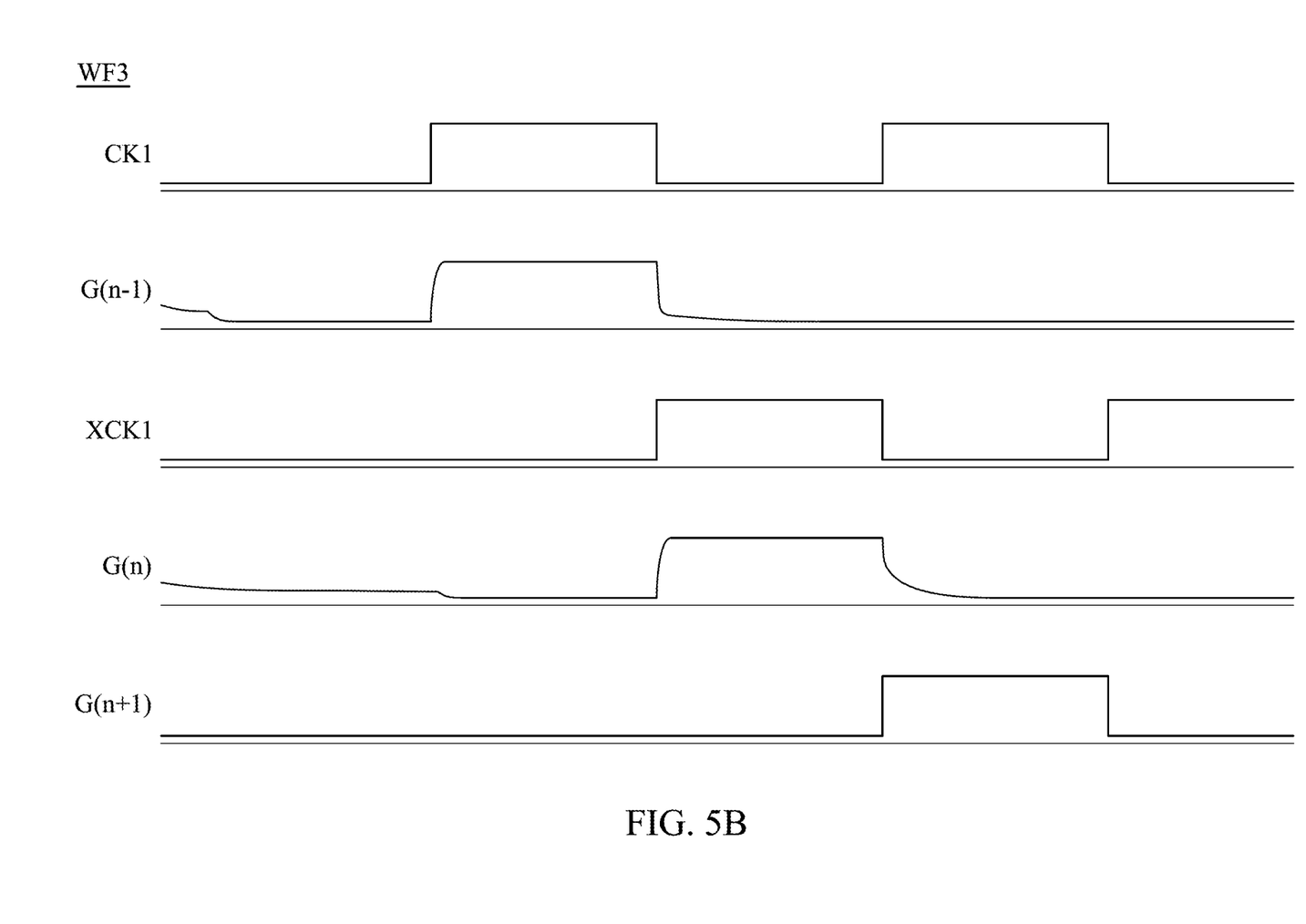
FIG. 5B is a waveform diagram of a waveform operated in the gate driver circuit shown in FIG. 5A, in accordance with some embodiments of the present disclosure.

Reference is made to FIG. 5B. FIG. 5B is a waveform diagram WF3 of a waveform operated in the gate driver circuit 120 shown in FIG. 5A according to some embodiments of the present disclosure. For illustration in FIG. 5B, the waveform diagram WF3 shows the waveform of the scanning signal G(n), the scanning signal G(n−1), the scanning signal G(n+1), the clock signal CK1, and the clock signal XCK1, and the corresponding relationship thereof with time.

In the embodiments of waveform diagram WF3, the clock signal CK1 and the clock signal XCK1 are inverted to each other. The scanning signal G(n−1), the scanning signal G(n), and the scanning signal G(n+1) are outputted in sequence as logic high level according to the clock signal CK1 and the clock signal XCK1, and when each of the scanning signal G(n−1), the scanning signal G(n), and when the scanning signal G(n+1) is outputted as logic high level, the output of the previous stage is pulled down to logic low level. In some embodiments, the gate driver circuit 120 outputs the scanning signals which have logic high level in sequence to each row in the pixel array 140, respectively.

The operations of the gate driver circuit 120 mentioned above are provided for illustrative purposes. Various operations of the gate driver circuit 120 are within the contemplated scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display system, comprising a display device, and a circuit device, wherein the circuit device is located at a first layer, wherein the display device comprises:
   a pixel array, located at a second layer which is different from the first layer;
   an antenna, located at the second layer, configured to transmit a radio frequency (RF) signal in response to a wireless communication;
   a reader circuit, located at the second layer, coupled to the antenna, and configured to receive the RF signal; and
   a gate driver circuit, located at the second layer, coupled to the reader circuit and the pixel array,
   wherein the reader circuit is further configured to generate a clock signal according to the RF signal and transmit the clock signal to the gate drive circuit, wherein the gate driver circuit is configured to generate a plurality of scanning signals according to the clock signal and transmit the plurality of scanning signals to the pixel array.

2. The display system of claim 1, wherein the circuit device is coupled to the display device, wherein the circuit device comprises a driver circuit, wherein the antenna responds to the wireless communication, the driver circuit is configured to provide the RF signal to the antenna, in order to make the antenna transmit the RF signal to the reader circuit.

3. The display system of claim 1, wherein the reader circuit comprises:
   a level shift circuit configured to output the clock signal according to the RF signal.

4. The display system of claim 1, wherein the gate driver circuit comprises a plurality of shift registers, wherein each of the plurality of shift registers is configured to receive the clock signal, and configured to generate a corresponding scanning signal of the plurality of scanning signals according to the clock signal to drive the pixel array.

5. A display system, comprising:
   a circuit device, located at a first layer;
   a pixel array, located at a second layer which is different from the first layer;
   a reader circuit, located at the second layer, configured to receive a radio frequency (RF) signal to generate a first control voltage and a second control voltage; and
   a gate driver circuit, located at the second layer, coupled to the pixel array and the reader circuit, configured to receive the first control voltage and the second control voltage, and configured to generate a scanning signal according to the first control voltage and the second control voltage to control the pixel array,
   wherein the pixel array, the reader circuit, and the gate driver circuit are implemented on a display device of the display system.

6. The display system of claim 5, further comprising:
   an antenna coupled to the reader circuit, configured to sense a near-filed communication (NFC) to transmit the RF signal to the reader circuit, wherein the antenna is implemented on the display device.

7. The display system of claim 6, further comprising:
   a control circuit implemented on the circuit device, coupled to the display device, wherein the control circuit comprises a rectifier, when the antenna senses the NFC, the rectifier is configured to rectify the RF signal and transmit the rectified RF signal to the reader circuit through the antenna.

8. The display system of claim 5, wherein the reader circuit comprises:
   a charge pump circuit configured to receive the RF signal, to generate the first control voltage according to a positive part of the RF signal, and to generate the second control voltage according to a negative part of the RF signal,
   wherein the first control voltage is larger than the second control voltage.

9. The display system of claim 5, wherein the gate driver circuit comprises a multi-stage shift registers configured to receive the first control voltage and the second control voltage, the multi-stage shift registers is further configured to receive a clock signal and to generate the scanning signal according to the clock signal, the first control voltage, and the second control voltage.

* * * * *